United States Patent [19]

Goetzberger et al.

[11] 4,110,123
[45] Aug. 29, 1978

[54] APPARATUS FOR CONVERTING LIGHT ENERGY INTO ELECTRICAL ENERGY

[75] Inventors: Adolf Goetzberger, Merzhausen; Waldemar Greubel, Denzlingen, both of Fed. Rep. of Germany

[73] Assignee: Fraunhofer-Gesellschaft zur Forderung der angewandten Forschung e.V., Munich, Fed. Rep. of Germany

[21] Appl. No.: 793,816

[22] Filed: May 4, 1977

[30] Foreign Application Priority Data

May 6, 1976 [DE] Fed. Rep. of Germany ....... 2620115
Jun. 24, 1976 [DE] Fed. Rep. of Germany ....... 2628291

[51] Int. Cl.² .......................................... H01L 31/04
[52] U.S. Cl. .......................... 136/89 HY; 136/89 PC; 250/211 R; 250/213 R; 252/301.16; 252/301.36
[58] Field of Search ............... 136/89 HY, 89 PC; 250/211 R, 213 R

[56] References Cited

U.S. PATENT DOCUMENTS

| | | | |
|---|---|---|---|
| 3,020,411 | 2/1962 | Cheroff | 250/208 |
| 3,426,212 | 2/1969 | Klaas | 250/226 |
| 3,591,420 | 7/1971 | Streed | 136/89 |
| 3,751,303 | 8/1973 | Kittl | 136/89 |
| 3,880,663 | 4/1975 | Shaw et al. | 106/47 Q |
| 3,912,931 | 10/1975 | Gravisse et al. | 250/458 |
| 3,929,510 | 12/1975 | Kittl | 136/206 |
| 4,021,267 | 5/1977 | Dettling | 136/89 PC |

FOREIGN PATENT DOCUMENTS

2,501,907  7/1976  Fed. Rep. of Germany ............ 136/89

Primary Examiner—Aaron Weisstuch
Attorney, Agent, or Firm—John C. Smith, Jr.

[57] ABSTRACT

An apparatus for the conversion of light energy into electrical energy, by which solar energy may be converted into electrical energy effectively and cheaply. The invention further relates to fluorescent centers (light concentrators) which consist of thin layers of transparent solid or liquid materials with embedded fluorescent centers and which in conjunction with solar cells serve to convert solar energy into electrical energy.

20 Claims, 15 Drawing Figures

APPARATUS FOR CONVERTING LIGHT ENERGY INTO ELECTRICAL ENERGY

BACKGROUND OF THE INVENTION

The generation of energy by means of solar cells has up to now not yet reached the potential hoped for, since physical and technical problems prevented this. These are:

1. Qualitatively good solar cells are by far too expensive to produce in sufficient quantity to cover large areas therewith.
2. The efficiency of known solar cells is low. Very good silicon solar cells today have an efficiency of 12 percent. GaAS solar cells reach up to 18 percent, but are much too expensive.

A summary of prior art and in particular a survey of present concentrator concepts and economics of concentration is included in: Proceedings of the Symposium on Films for solar Energy, published in: Journal of Vacuum Science and Technology, 12, Sept./Oct. 1975.

BRIEF DESCRIPTION OF THE DRAWINGS

Some preferred embodiments of the invention will now be described by way of example and with reference to the accompanying drawings, in which.

DESCRIPTION OF THE PREFERRED EMBODIMENTS

In the apparatus proposed here, the mentioned disadvantages are to be materially reduced. In doing so, the outset is from the principle of light concentration as used for indicating systems (see FIG. 1). Therein, light 2 is concentrated in a plastic plate 1 a few millimeters thick and consisting of transparent base material, such as plexiglass, containing embedded fluorescent centers which fluorence in a narrow wavelength range. The fluorescent light 3 for the major part stays in the plastic plate by total reflection. The non-totally reflected proportion V is $$V = \frac{n - \sqrt{n^2 - 1}}{n}$$

($n$ is the refraction coefficient of the plastic base material; for plexiglass: $n = 1,49$; $V = 25\%$)

Figure 1:
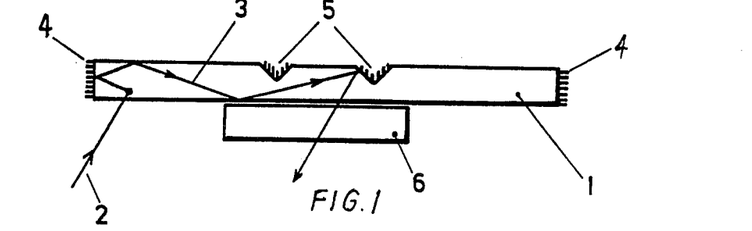
FIG. 1 is a cross section of an apparatus for light concentration for use in indicating systems.

At the faces 4, the plate is reflectively coated so that no light is able to be emitted. At the desired location the light is extracted by deflection at a suitable structuring, e.g. a reflectively coated notch 5. In FIG. 1, the reference numeral 6 denotes an indicating system which acts as a controllable light gate.

Figure 2:
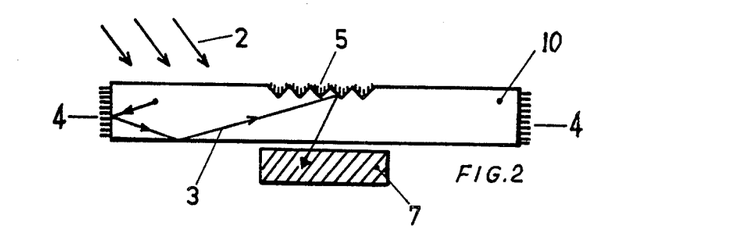
FIG. 2 is a cross section of an apparatus for light concentration for use in solar cells.

It is now proposed here to combine such a light concentrator with a solar cell, which brings about substantial advantages. An estimation and also experiments show that about 75% of the incident light is able to be extracted concentrated form at any desired location of the plate. A limitation in this regard is that the length dimension of the plate must stay below the absorption length of the fluorescent light (the order of one meter is easy to achieve). A simple embodiment is shown in FIG. 2. Sunlight 2 is absorbed in light concentrator 10 and is converted with approximately 100 percent quantum yield into fluorescent light 3 and is deflected at the reflectively coated notches 5 so that it leaves the plate and impinges a solar cell 7, where it is converted into electrical energy.

Figure 3:
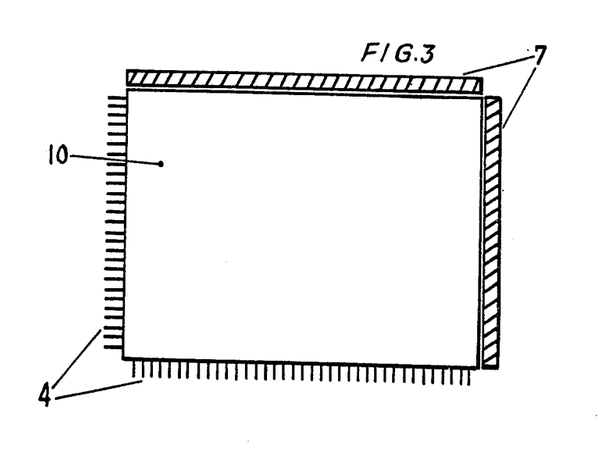
FIG. 3 is a light concentrator for solar cells with light neutralization at unreflectorized faces.

Another very effective embodiment is shown in FIG. 3. The plate-shaped light concentrator 10 is reflectively coated at two faces 4 and unreflectorized at the remaining two faces. At the unreflectorized faces, the fluorescent light is emitted and impinges the solar cells 7.

The use of such a concentrator initially brings about a substantial price reduction of the entire energy conversion system, since the area of the solar cell may be smaller by a factor 10 to 2000 than the energy collecting area. The plastic plate is materially cheaper than the solar cell. Therefore, optimum solar cells with a high efficiency may be used.

The light concentrator also brings about physical advantages, however, which permit an increase in the efficiency beyond that of the best normal solar cells. These advantages are:

1. Optimization of the solar cell for a narrow wavelength range.

Figure 8:
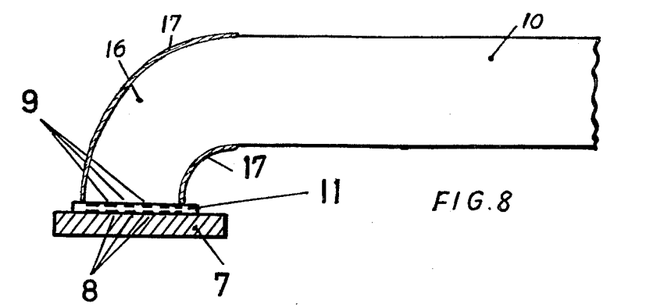
FIG. 8 is a light neutralization arrangement through a cured attachment and adaptation of the neutralization structure to the conductor path structure of the solar cell.

Since the fluorescent light is generated in a narrow wavelength range typical half-width value is 40 nanometers), the solar cell may be specifically designed and optimized for this. This pertains to the depth of the p-n-junction antireflection layers and in particular to the width of the forbidden band of the semi-conductor. The optimization may also pertain to the geometrical deisgn of the structure of the solar cell. Solar cells must have contact grids on their surfaces, since the thin surface layers of the semiconductor do not have sufficient conductivity. The semiconductor areas under these metallized surfaces are lost for light collection. According to FIG. 8, the contact grids may be excluded from radiation and thus be dimensioned to an optimum. To accomplish this, a reflector structure 9 is applied to the flourescent light emission surface of the light concentrator which precisely corresponds to the contact grid structure 8 of the solar cell 7. The fluorescent light emission surface and the solar cell are then brought into optical contact with one another through a suitable film 11 in such a way that the structures 8 and 9 overlap.

2. Effectiveness of the apparatus for diffuse daylight.

The concentrator is also fully sensitive to diffuse light. Arrangements are, for instance, known where sunlight is concentrated by means of reflectors on solar cells of high efficiency. These have the disadvantage that the reflectors must be permanently oriented toward the sun so that this arrangement works only with clear sky conditions. It is likewise known that for diffuse light incidence and slightly covered sky conditions the the incident radiation energy is only very slightly reduced, but rather is undirected. The apparatus according to the invention has the advantage that it remains fully effective for diffuse light and also requires no complex follow-up devices.

3. Effective utilization of the energy of sunlight.

Conventional solar cells have the disadvantage that the full energy of incident light quanta cannot be utilized, since for all photons with a higher energy than that of the forbidden band of the semi-conductor material this excess energy is not converted into electrical energy, but is lost as heat. Silicon, e.g., has a band width of 1.1 eV. The maximum photon energy of sunlight, however, is 2.58 eV. Thus, for each photon independent of its original energy, only about 1 eV. is converted, and this quantitatively means that in a silicon ell about 40% of the incident photon energy is not utilized. There are proposals how the efficiency could be increased by using a solar cell with a variable band gap or by heterojunction or by lamination of solar cells with varying band gaps. All these proposals have gained no significance up to now, since they are either difficult to realize technically or are too high in cost.

By means of the concentrators according to this invention, a better utilization of the various energy ranges of sunlight may be achieved in a very simple way.

Figure 4:
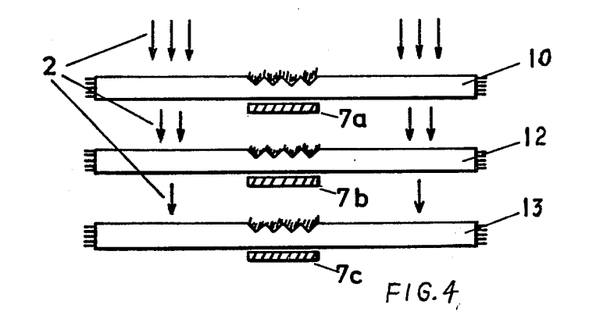
FIG. 4 is a multiple layer arrangement of light concentrators with concentrators and solar cells arranged in series.

FIG. 4 shows a multiple layer arrangement with concentrators and solar cells arranged in series. Concentrator 10 is designed in such a way that the higher energy proportions of sumlight 2 including UV, thus the shorter waves are converted into fluorescent light of longer wavelength (i.e., lower energy). Solar cell 7a is correlated to this wavelength, i.e., it consists of a semi-conductor material of relatively large band gap. Since the fluorescent centers embedded in concentrator 10 absorb only in the range of short wavelengths, light passes unobstructed in the wavelength range in excess thereof and strikes concentrator 12 which converts a further wavelength range and passes it to solar cell 7b. The solar cell 7b is accordingly designed, i.e., it consists of semi-conductor material of a lesser band gap than the solar cell 7a. Concentrator 13 and solar cell 7c similarly are correlated to the long-wave proportion. FIG. 4 of course only represents an embodiment by way of example. More than three layers, but also only two layers may be used. By using concentrators repeatedly arranged in series with adapted solar cells, a material increase of efficiency is able to be obtained which substantially outrates the losses of the concentrators. Thus, the overall system has an efficiency which is higher than is possible to achieve with the best known solar cells.

The series arrangement is possible only with the concentrator system, since solar cells themselves cannot be rendered radiation-permeable without substantial impairment. Solar cells contain electrical contacts as well as highly doped zones both of which have a high absorption. Since the base material of the concentrators is transparent, lower reflection losses also occur than for semi-conductors. In the series arrangement reflection losses do occur at the interfaces, however, these are low, because of the high degree of transparency. On the other hand, an increase in efficiency results, because fluorescent light emitted downwardly outside of the angle of total reflection is received by the next plate and is utilized there again by the embedded fluorescent centers. Losses are thus approximately halved.

The good transparency of the concentrators also permits utilization of heat radiation not convertible by solar cells.

Figure 9:
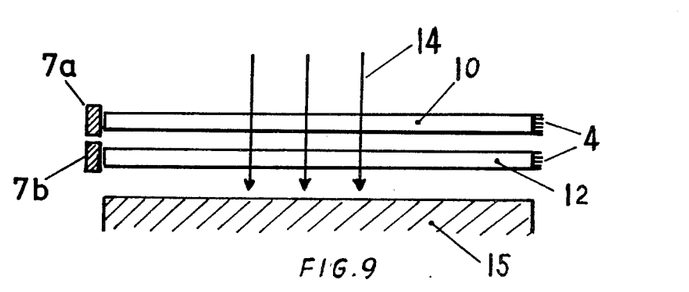
FIG. 9 is a two-layer arrangement of light concentrators with an additional absorber layer for infrared radiation.

FIG. 9 shows how IR radiation 14 passes through concentrators 10 and 12 and strikes IR radiation absorber 15 which converts this residual radiation into heat.

4. Specific embodiments.

Figure 5:
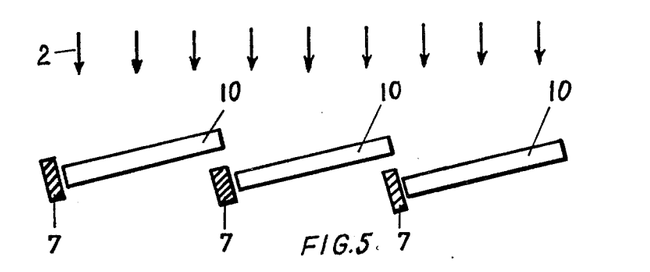
FIG. 5 is a light concentrator arrangement with light neutralization at unreflectorized faces and full area utilization.

Geometries of the concentrators may be of different nature, and in particular the neutralization of light may be optimized. The embodiment shown in FIGS. 1, 2 and 4 with the solar cells in the middle of the concentrators is only one possibility. The solar cells may also be arranged at the edge of the concentrators, and thereby the area may be fully utilized, as illustrated in FIG. 5. There the solar cells 7 are attached to unreflectorized of the light concentrators 10.

Figure 6:
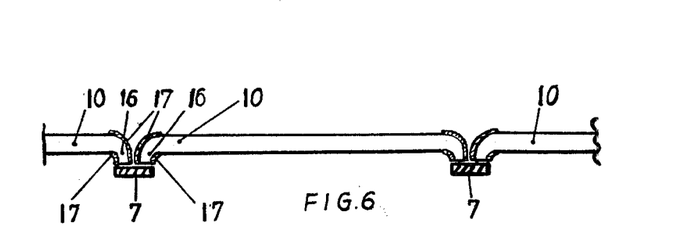
FIG. 6 is a light concentrator arrangement with light neutralization through curved attachments for a 90° light deviation.

A further possibility of light neutralization is represented by FIG. 6. In this modification, the light concentrators 10 have curved attachments 16 at opposite edges for a 90° deflection of light. The surfaces of the curved attachments 16 are provided with a reflecting coating 17 in order to avoid light losses. The reference numerals 7 denote the solar cells again. It should be appreciated that in the arrangements shown antireflection layers on the solar cells are not mandatory, since reflected light remains in the system and is not lost.

Figures 7A, 7B:
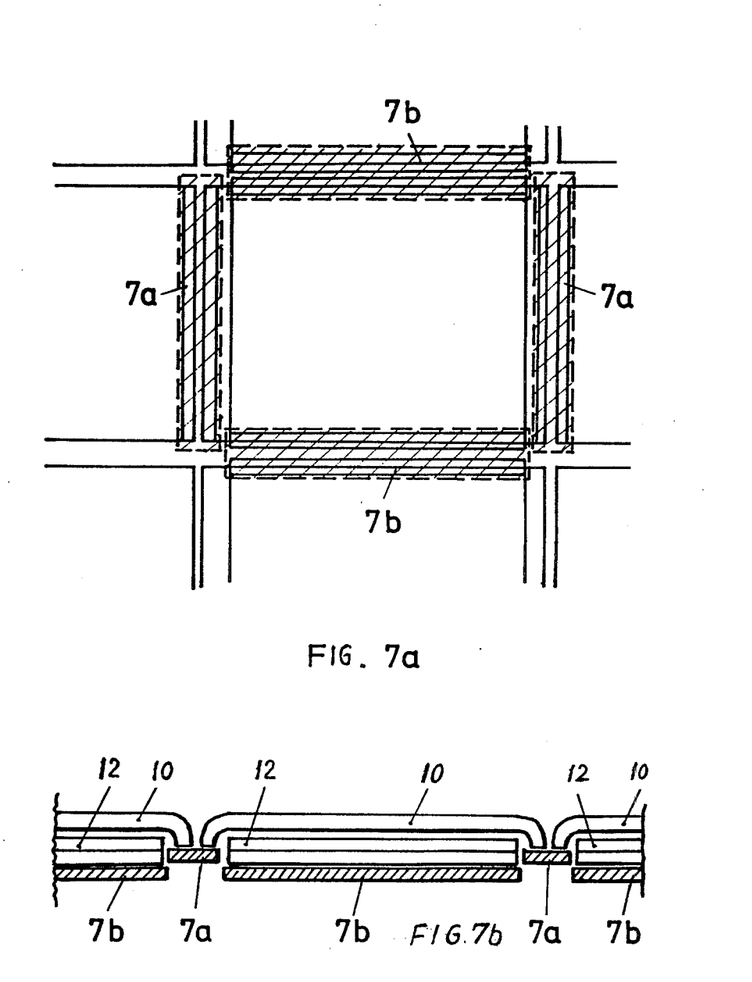
FIG. 7a is a plan view of a two-layer arrangement of light concentrators.
FIG. 7b is a cross section thereof.
Figure 10:
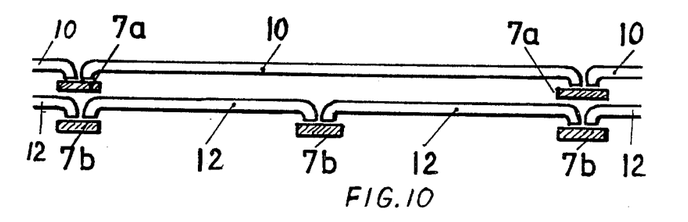
FIG. 10 is a two-layer arrangement of light concentrators with light concentration of varying magnitude.

The arrangement shown in FIG. 6 is also suited for multiple layer arrangements. FIGS. 7a and 7b show a two-layer arrangement. 10 are the upper concentrators with their associated solar cells 7a. Reference numeral 12 denotes the lower concentrators with their associated solar cells 7b. The solar cells having a selective sensitivity for short wavelengths have an increased efficiency at a higher light concentration and are non-sensitive to elevated temperatures. Therefore, the concentration factor for the various wavelength ranges may be selected differently. This is illustrated in FIG. 10 for a two-layer arrangement. For the upper concentrators 10 with their associated solar cells 7a which receive the shorter wavelengths, light concentration is higher than for the lower concentrators 12 with their associated solar cells 7b which convert the longer-wave range.

In the solar cells, a substantial part of light energy is converted into heat. In order to utilize this heat and in order to maintain the solar cells at an advantageous temperature, it is advisable to assemble the solar cells on a cooling apparatus for discharging the heat.

It may be mentioned that there exists the possibility of simultaneously combining light concentrators of the type described both with solar cells and with indicating systems. This means that one part of the concentrated ambient light is used for illumination of the indicating system and the other part is supplied for the generation of electrical energy for controlling the indication of a solar cell. In conjunction with an electrical accumulator as energy storage means indicating apparatus is thus obtained, the energy requirements of which are at any time fully covered by ambient light.

A particularly advantageous embodiment of light concentrators results when flat cells, preferably of glass, are used, which contain liquid transparent solvents which include fluorescent centers.

Figure 12:
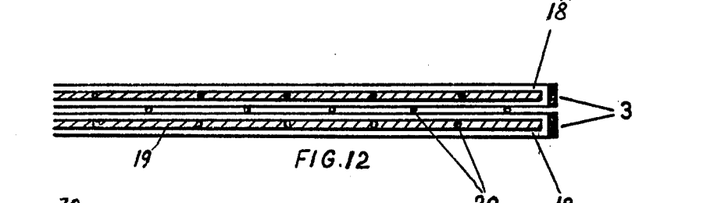
FIG. 12 is a cross section of a two-layer arrangement of light concentrators, comprising glass cells which contain solvent with fluorescent centers.

In FIG. 12 a two-layer arrangement of light concentrators is illustrated which comprises glass cells 18 containing solvent with fluorescent centers 19. Since it is beneficial for achieving high concentration rates to use thin-walled cells, the installation of supports of solder glass pellets 20 offers itself for spacing the glass walls and for mechanically stabilizing the entire arrangement. In order to avoid light losses, the glass cells 18, the solutions 19, and the glass pellets 20 should have the same refraction coefficient. The most important advantages of this embodiment are: Fluorescent materials chemically or photochemically instable in longtime operation may easily be exchanged. The solvents may be regenerated. The glass cells have a long operational life and keep water and gases away which often greatly impair the life of fluorescent materials. Liquid mixtures which permit optimum concentrations at the same time for several different types of fluorescent materials are of choice in virtually unlimited combinations. Also, there is the possibility with liquids having relatively high static dielectric constants (relatively frequent with organic liquids) to substantially reduce the overlapping of absorption and emission spectra of the fluorescent centers dissolved therein and to thereby greatly increase the effectiveness of the light concentrators. The wave number difference between absorption and emission maximum $\Delta \bar{V}$ which mainly depends on the inner structure of the fluorescent molecule (shape and relative position of the potential energy curves of ground and excited states inherent rotation possibilities, etc. is also influenced by the dielectric properties of the fluorescence molecules and their environment (solvent molecules). It is known that $\Delta \bar{V}$ may be increased when on the one hand the static dielectric constant of the solvent is high and on the other hand the difference of the dipole moments of the ground base and excited states of the fluorescence molecules is as large as possible (see e.g. Landolt-Bornstein, Neue Serie II/3, page 285, Lumineszenz Organischer Substanzen, Berlin 1967).

Besides the mentioned homogeneous mixtures for realizing light concentrators, depending on the circumstances, layers of heterogeneous mixtures, such as for instance suspensions of transparent solid or liquid, embedding substances with fluorescent particles, e.g., solid solutions of fluorescent centers, may be of an advantage, the refraction coefficients of the embedding substance and of the fluorescent particles being correlated with one another so that the fluorescent light at the particles is not scattered. Such mixtures could for instance be of an advantage when in a concentrator layer several fluorescent materials are used in conjunction which are incompatible with one another chemically.

Figure 11:
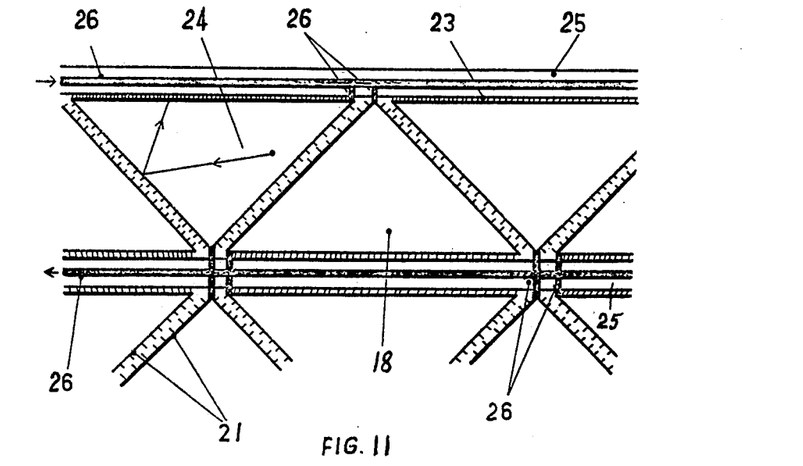
FIG. 11 is an example for an advantageous geometrical embodiment of a system of light concentrators with cooled solar cells.

An example for an advantageous geometrical assembly of a system of light concentrators with liquid exchangeable fluorescent solutions contained in cells and with cooled solar cells is illustrated in FIG. 11. The cells 18 have the shape of isosceles triangles and possess reflectively coated faces 21 which provide the advantage that the travel distances of the fluorescent light beams 24 will be optimally short. At the third non-reflectively coated side, there is a solar cell 23 which is connected to the cell through a film of optical contacting agent in order to achieve optimum utilization of the fluorescent light. For example, silicon oils having viscosities of $10^6$ centistokes at normal temperatures and of high chemical stability which have proven well suited for optically contacting scintillators with photo-multipliers are particularly suited as contact agents. This permits the solution of the problem of different degrees of heat expansion. The backsides of the solar cells 23 are in good heat contact with coolant lines 25. Above or below the coolant lines 25, there are solution exchange lines 26 through which the fluorescent solutions are renewed, when required. The cells are all connected to these lines in parallel.

Figure 13:
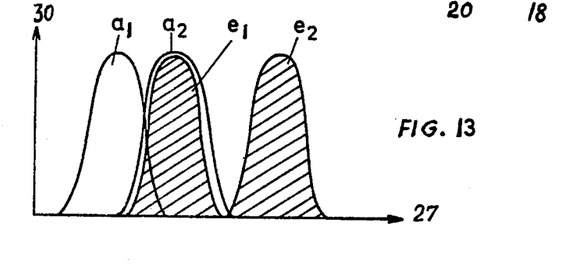
FIG. 13 is a diagrammatic illustration of the position of absorption and emission curves of a two-stage fluorescent material "cascade"

When there are two fluorescent materials in conjunction in a solution (see FIG. 13) wherein the hatched emission band $e_1$ of the first approximately covers the absorption band $a_2$ of the second, there is the possibility to convert the light absorbed in the two absorption bands $a_1$ and $a_2$ into the emission band $e_2$ of the second fluorescent material. Such a combination will be called a two-step fluorescent material "cascade" hereinafter as an abbreviation. Such a cascase is of an advantage in different ways. By such a cascade, the proportion of the non-totally reflected light may be maintained relatively small, the losses do not multiply, since the major part of the fluorescent light in band $e_1$ is absorbed by the second fluorescent material before arriving at the interface. For higher fluorescent material concentrations, it may also occur that the excitation energy goes from the one fluorescence molecule type to the other non-radiatingly and is then emitted by the latter in the band $e_2$. The number of steps of such a cascade will always be reasonably small when it is considered that, in order to not restrict the choice of potential fluorescent materials too much, quantum efficiencies of about 80% must be expected. Advantages is taken of a further benefit of a cascade in the following embodiment.

Figure 14:
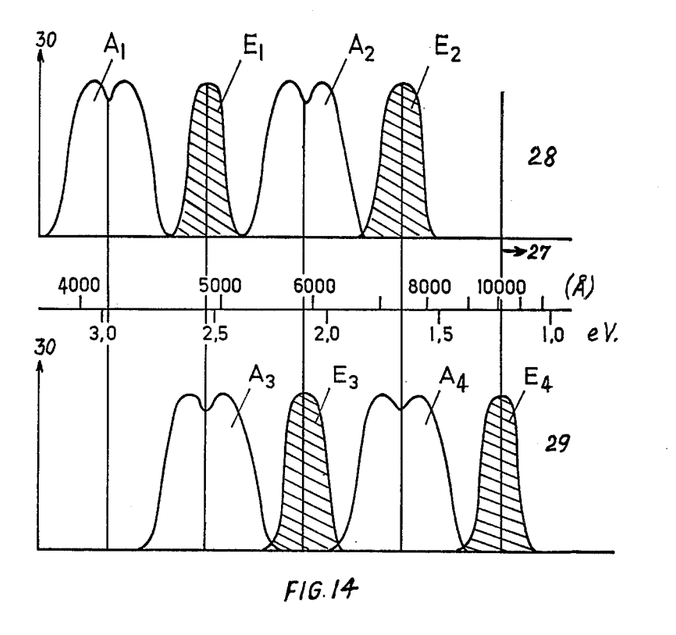
FIG. 14 is an embodiment by way of example, in particular suited for silicon solar cells, for an optimum position and distribution of the absorption and emission bands in a two-layer arrangement of light concentrators.

In FIG. 14 an embodiment for an optimum position and distribution of absorption and emission bands 30 in a two-layer arrangement 28 and 29 of light concentrators is shown. It is particularly suited for silicon solar cells. In FIG. 14 the absorption bands $A_1$ to $A_4$ are realized by two-step fluorescent material cascades according to FIG. 13. The emission bands are designated by $E_1$ to $E_4$.

The above-described cascade permits absorption bands to be obtained energetically approximately twice as wide relative to the emission band width by superimposition. This facilitates the simultaneous fulfilment of the two conditions essential for an effective utilization of solar energy by means of the concentrators described, namely that 1. the fluorescence light emission bands provided for light progression within the same layer overlap as little as possible with adjacent absorption bands, and 2. the absorption bands of the different layers gaplessly overlap.

The fact that the absorption coefficient for silicon decreases with increasing wavelength 27 disfavors a one-layer concentrator arrangement for use with silicon solar cells, so that it is advantageous to convert all photons of solar light through plural-step "fluorescent material cascades" in a range in the near IR.

The distribution of the spectrum shown in FIG. 14 essential only to explain the main aspects. Sunlight utilizable by the silicon solar cell could also be utilized approximately fully in a two-layer arrangement of concentrators where in each concentrator layer 28, 29 only one 2-step fluorescent material cascade is used in which fluorescent materials are used having accordingly wider absorption bands.

For reducing light losses by self-absorption as a result of overlapping of the emission and absorption band 30 of a fluorescent material, there is also the possibility of accommodating the fluorescent material in a thin marginal layer of the light concentrator in an accordingly higher concentration, e.g. in the instance of solid solvents realizable by diffusing in the fluorescent material or for heterogeneous mixtures of the nature described further above by embedding of fluorescent particles in solid or liquid embedding agents with the same refraction coefficient.

As a last example of the apparatus of this invention, it is further set forth how the light concentrator principle in conjunction with indicating apparatus with the concurrrent use of solar cells is able to be used for an optimum utilization of solar energy. The indicating apparatus will only use the spectrum range from blue to green or yellow in order to utilize the eye's spectral sensitivity. It is therefore advisable to collect the upper portion of the sun's spectrum for illumination of the indicator via a first concentrator layer and the remaining spectrum range in a second concentrator layer behind the first and to feed it to a solar cell for generating electrical energy for the current supply of the indicator.

The invention may be embodied in other specific forms without departing from the spirit of or essential characteristics thereof. The embodiments are therefore to be considered in all respects as illustrative and not restrictive.

What is claimed is:

1. An apparatus for converting solar energy into electrical energy, wherein light is collected in a light concentrator comprising a transparent layer, the refraction coefficient of which is greater than that of the ambient medium and which contains fluorescent centers and is fed to a solar cell, characterized in that more than one concentrator/solar cell combination is stacked on top of another through the intermediary of a medium having a smaller refraction coefficient than that of the concentrators, each concentrator being adapted to convert a portion of the incident spectrum into fluorescent light and supply it to a solar cell.

2. An apparatus according to claim 1, wherein the concentrators are so arranged that the concentrator upon which radiation strikes first absorbs the shortest wavelengths, the next to follow absorbs a somewhat longer wavelength range and the last absorbs the longest wavelength range.

3. A apparatus according to claim 2, wherein an apparatus for the absorption and utilization of the heat radiation passing through the last concentrator is provided behind said last concentrator.

4. An apparatus according to claim 2, wherein the concentration factor for the shorter wavelength concentrators is higher than that for the longer wavelength concentrators.

5. An apparatus according to claim 1, wherein reflecting structures on the emission surface of the concentrator are correlated to the contact grid geometries of the solar cell in such a way that no light is emitted onto the contact grids of the solar cell.

6. An apparatus according to claim 1, wherein said intermediary medium has a refraction coefficient of 1.

7. An apparatus according to claim 1, wherein an arrangement of two superimposed light concentrators is used, the shorter-wave proportion of the sun spectrum collected in one light concentrator being used for the illumination of an indicating apparatus and the remaining longer-wave spectrum range being collected in the second concentrator layer and supplied to a solar cell.

8. An apparatus according to claim 1, wherein the light concentrators consist of cells which contain solutions of liquid transparent solvents with fluorescent centers.

9. An apparatus according to claim 8, further comprising transparent glass pellets separating said cells, said cells, said solutions and said transparent glass pellets having the same refraction coefficient.

10. An apparatus according to claim 8, wherein said solvents consist of liquid mixtures in order to permit optimum concentrations for a plurality of different types of fluorescent centers at the same time.

11. An apparatus according to claim 8, wherein said solvents have static dielectric constants of between 5 and 100.

12. An apparatus according to claim 1, wherein said light concentrators consist of layers which are made of heterogeneous mixtures of transparent solid or liquid substances in which said fluorescent centers are embedded.

13. An apparatus according to claim 12, wherein said transparent embedding substances and said flourescent centers have the same refraction coefficient.

14. An apparatus according to claim 12, wherein said flourescent centers consist of solid solutions of fluorescent materials.

15. An apparatus according to claim 1, wherein an arrangement of two superimposed light concentrators is used, each layer containing fluorescent materials which are correlated to one another in such a way that on the one hand fluorescent light emission bands provided for light progression within the same layer overlap as little as possible with adjacent absorption bands and on the other hand the absorption bands of the different layers gaplessly overlap.

16. An apparatus according to claim 15, wherein the fluorescent materials are disposed in a thin marginal layer of the light concentrator.

17. An apparaus according to claim 16, wherein the distribution of the fluorescent material in a thin marginal layer is produced by fluorescent material diffused into a solid tranparent solvent.

18. An apparatus according to claim 16, wherein the distribution of the fluorescent material in a thin marginal layer is produced by depositing the fluorescent particles in a solid or liquid embedding agent at its margin.

19. An apparatus according to claim 1, wherein the light concentrators have the shape of isosceles triangles, the faces of the two equally long sides are reflectively coated and the solar cells are arranged at the third, non-reflectively coated side.

20. An apparatus according to claim 19, wherein the triangular light concentrators are arranged in an area between coolant lines extending parallel to the third side.

* * * * *